United States Patent
Watanabe

(10) Patent No.: US 10,951,238 B1
(45) Date of Patent: Mar. 16, 2021

(54) MEMORY SYSTEM AND METHOD FOR CONTROLLING NON-VOLATILE MEMORY

(71) Applicant: Kioxia Corporation, Minato-ku (JP)

(72) Inventor: Daiki Watanabe, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/795,657

(22) Filed: Feb. 20, 2020

(30) Foreign Application Priority Data

Aug. 21, 2019 (JP) .............................. JP2019-151444

(51) Int. Cl.
| | | |
|---|---|---|
| H03M 13/00 | (2006.01) | |
| H03M 13/29 | (2006.01) | |
| G06F 11/10 | (2006.01) | |
| H03M 13/15 | (2006.01) | |

(52) U.S. Cl.
CPC ..... *H03M 13/2927* (2013.01); *G06F 11/1068* (2013.01); *H03M 13/152* (2013.01); *H03M 13/1515* (2013.01); *H03M 13/2918* (2013.01); *H03M 13/2981* (2013.01)

(58) Field of Classification Search
CPC ......... H03M 13/2927; H03M 13/2918; H03M 13/1515; H03M 13/152; H03M 13/2981; G06F 11/1068
See application file for complete search history.

(56) References Cited

U.S. PATENT DOCUMENTS

| | | |
|---|---|---|
| 8,086,933 B2 | 12/2011 | Yamaga |
| 8,751,896 B2 | 6/2014 | Yamaga |
| 9,397,706 B1 | 7/2016 | Steiner et al. |
| 9,710,199 B2 * | 7/2017 | Ioannou ................. G06F 11/108 |
| 9,996,420 B2 * | 6/2018 | Mittelholzer ....... G06F 11/1012 |
| 2010/0313099 A1 * | 12/2010 | Yamaga ............ H03M 13/2906 714/755 |
| 2017/0187395 A1 | 6/2017 | Watanabe et al. |
| 2017/0279468 A1 | 9/2017 | Kumar et al. |
| 2019/0012231 A1 * | 1/2019 | Chung ................. G06F 11/1068 |

FOREIGN PATENT DOCUMENTS

JP 2001-202793 A 7/2001

* cited by examiner

*Primary Examiner* — Samir W Rizk
(74) *Attorney, Agent, or Firm* — Oblon, McClelland, Maier & Neustadt, L.L.P.

(57) ABSTRACT

A memory system of an embodiment includes a non-volatile memory and a memory controller. The memory controller generates an error correction code including a first and second symbol groups. The first symbol group is a set of symbols shared between a first component code and a third component code and/or a fourth component code. The second symbol group is a set of symbols shared between a second component code and the third component code and/or the fourth component code. The first and third component codes have a lower correction capability than the second and fourth component codes, respectively. The ratio of symbols protected by the third component code is smaller in the second symbol group than in the first symbol group. The ratio of symbols protected by the fourth component code is larger in the second symbol group than in the first symbol group.

20 Claims, 10 Drawing Sheets

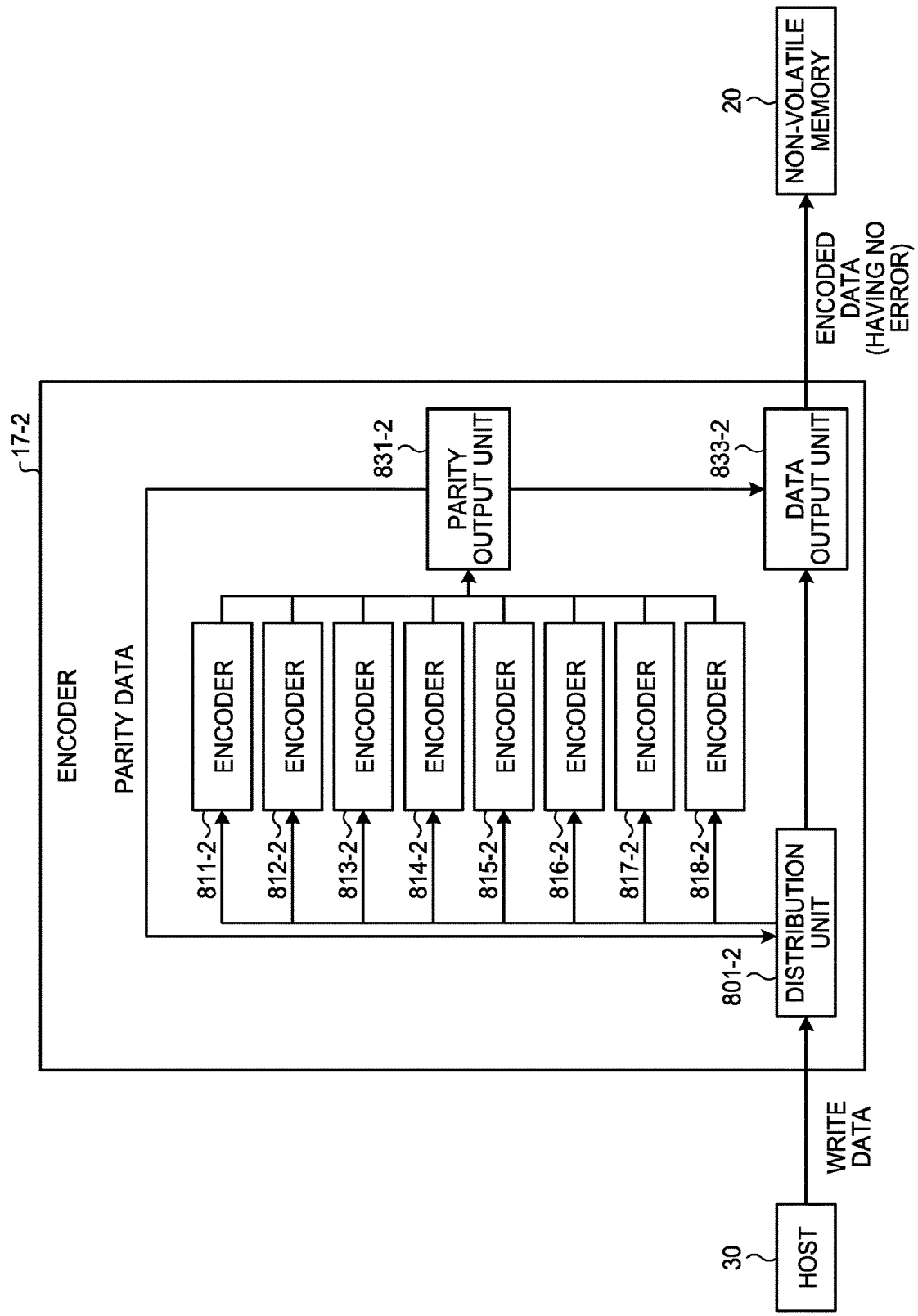

MEMORY SYSTEM AND METHOD FOR CONTROLLING NON-VOLATILE MEMORY

CROSS-REFERENCE TO RELATED APPLICATIONS

This application is based upon and claims the benefit of priority from Japanese Patent Application No. 2019-151444, filed on Aug. 21, 2019; the entire contents of which are incorporated herein by reference.

FIELD

Embodiments described herein relate generally to a memory system.

BACKGROUND

In general, data after being subjected to error correction coding is stored in memory systems in order to protect the data to be stored. For this reason, decoding is performed on the data after being subjected to the error correction coding when reading data stored in the memory system.

BRIEF DESCRIPTION OF THE DRAWINGS

FIG. 13 is a block diagram illustrating a functional configuration example of an encoder according to a second embodiment.

DETAILED DESCRIPTION

According to embodiments, a memory system including a non-volatile memory and a memory controller is provided. The memory controller generates an error correction code including a first and second symbol groups. The first symbol group is a set of symbols shared between a first component code and a third component code and/or a fourth component code. The second symbol group is a set of symbols shared between a second component code and the third component code and/or the fourth component code. The first component code has lower capability than the second component code, and the third component code has a lower correction capability than the fourth component code. The ratio of symbols protected by the third component code is smaller in the second symbol group than in the first symbol group. The ratio of symbols protected by the fourth component code is larger in the second symbol group than in the first symbol group.

Hereinafter, the memory system according to the embodiments will be described in detail below with reference to the attached drawings. Incidentally, the present invention is not limited to the following embodiments.

In recent years, the memory system using the non-volatile memory such as a NAND flash memory has been used in various places by taking advantage of its high speed. However, data read from the non-volatile memory is likely to have an error that is caused by a lapse of time after being stored in the non-volatile memory, noise generated at the time of reading and writing, or the like. Therefore, in general, an encoding process using an error correction code is executed on the data stored in the non-volatile memory, and a decoding process using the error correction code is executed at the time of reading, whereby the error included in the read data is removed.

Figure 1:
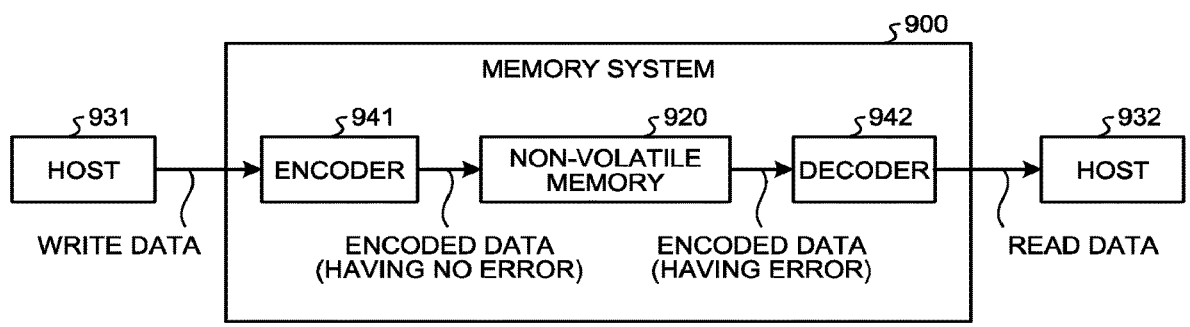
FIG. 1 is a diagram for explaining a general flow of an operation of protecting data with an error correction code.

FIG. 1 is a diagram for explaining a general flow of an operation of protecting data with the error correction code. Incidentally, a host in the present description may be an information processing device such as a personal computer, a server device, a portable information device, or a digital still camera.

A host 931 transmits data to be written (hereinafter referred to as write data) to a memory system 900. The memory system 900 encodes the write data received from the host 931 using an encoder 941, and writes the encoded data (code word) thus generated into a non-volatile memory 920. Therefore, the encoded data to be written to the non-volatile memory 920 basically has no errors.

The encoded data stored in the non-volatile memory 920 is read in response to a read request from a host 932, for example. Here, the read encoded data is likely to have an error. Therefore, the original code word is restored by executing decoding while removing the error included in the read encoded data using a decoder 942. Thereafter, the original code word or the restored write data before being subjected to encoding is transmitted to the host 932. Incidentally, the host 932 that has issued the read request may be the same host as the host 931 that has issued a write request or may be a different host.

There is a case in which a multi-dimensional error correction code is used as the error correction code. The multi-dimensional error correction code indicates a scheme in which a symbol, which is at least one or more constituent units of an error correction code, is multiply protected by a plurality of smaller component codes. Further, one symbol is formed of, for example, one bit (an element of a binary field) or an element of an alphabet such as a finite field other than the binary field.

Figure 2:
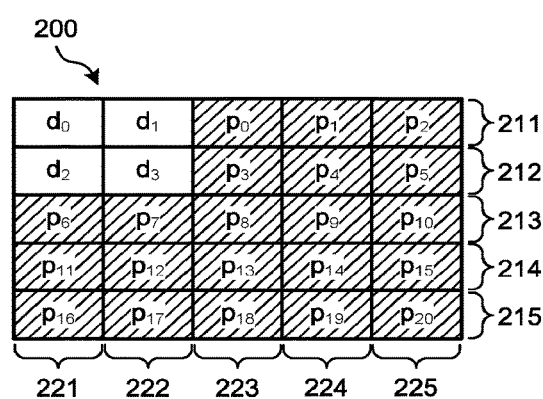
FIG. 2 is a view illustrating an example of a product code.

FIG. 2 illustrates a product code as an example of the multi-dimensional error correction code. In a product code 200 illustrated in FIG. 2, each of information bits (which may be symbols) $d_0$ to $d_3$, which are constituent units, has a structure protected by Hamming codes 211 to 215 and 221 to 225 having an information length of two bits and a parity length of two bits in each of a row direction (horizontal direction in the drawing) and a column direction (vertical direction in the drawing). In such a product code 200, all the information bits $d_0$ to $d_3$ and parity bits $p_0$ to $p_{20}$ are doubly protected by the Hamming codes in the row direction and the Hamming codes in the column direction. In the product code illustrated in FIG. 2, all symbols are doubly protected by component codes in the row direction (referred to as Dimension 1) and the column direction (referred to as Dimension 2). Incidentally, the multi-dimensional error correction code is not limited thereto, and may be a generalized low density parity check (LDPC) code, for example. In general multi-dimensional error correction codes including the generalized LDPC code, the multiplicity of protection may be different for each symbol, and further, the present technique can be applied to such a code configuration although it is difficult to group component codes into Dimension 1 and Dimension 2.

Figure 3:
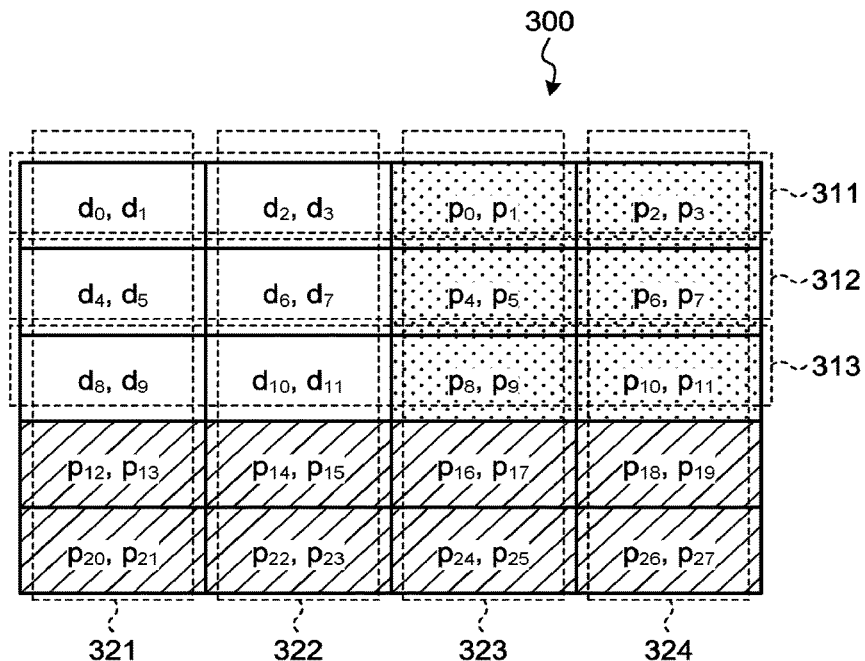
FIG. 3 is a view illustrating a configuration example of a block product code.

FIG. 3 is a view illustrating a configuration example of a block product code 300, which is another example of the multi-dimensional error correction code. The block product code 300 is a code in which information bits (which may be symbols) $d_0$ to $d_{11}$ are protected by three Hamming codes 311, 312, and 313 having an information length of four bits and a parity length of four bits in the row direction and protected by four Hamming codes 321, 322, 323, and 324 having an information length of six bits and a parity length of four bits in the column direction.

Parity bits $p_0$ to $p_{11}$ are parity bits of component codes in the row direction. Parity bits $p_{12}$ to $p_{27}$ are parity bits of component codes in the column direction. The information bits $d_0$ to $d_{11}$ and the parity bits $p_0$ to $p_{11}$ are always doubly protected by the component codes in the row direction and the component codes in the column direction. On the other hand, the parity bits $p_{12}$ to $p_{27}$ are not protected by the component codes in the row direction and are only protected by the component codes in the column direction, which is different from the product code 200. Therefore, the block product code 300 includes bits different in multiplicity. Meanwhile, the maximum value of the multiplicity, that is, the number of dimensions is two even in the block product code 300 similarly to the product code 200 of FIG. 2.

Although the number and configuration of the component codes in the row direction and the number and configuration of the component codes in the column direction are not uniform in the block product code 300, all the component codes have the same number of shared bits (two bits in the example of FIG. 3) similarly to the product code 200 illustrated in FIG. 2. The shared bit means a bit that is commonly encoded by a plurality of component codes. As an example, the information bits $d_0$ and $d_1$ are shared bits shared by the Hamming codes 311 and 321 which are the component codes.

In the following embodiments, not only the number and configuration of the component codes but also the number of shared bits is made non-uniform so as to improve the error correction capability of the error correction code.

First Embodiment

Figure 4:
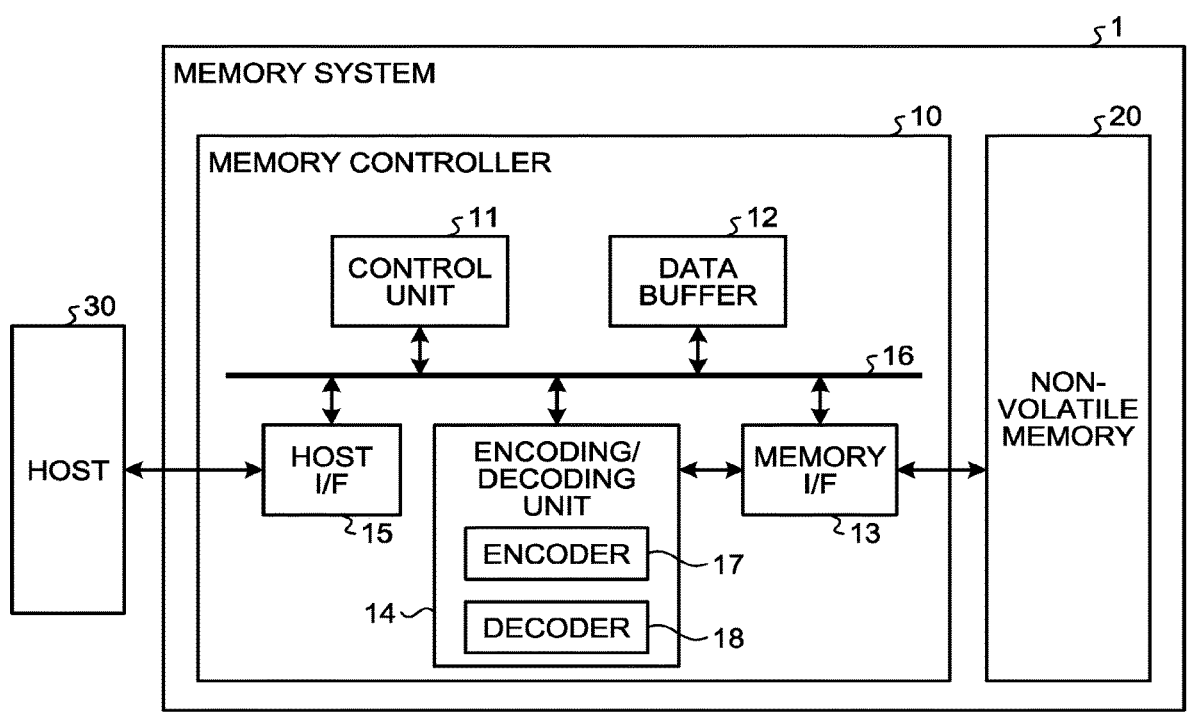
FIG. 4 is a block diagram illustrating a schematic configuration example of a memory system according to a first embodiment.

FIG. 4 is a block diagram illustrating a schematic configuration example of a memory system according to a first embodiment. As illustrated in FIG. 4, a memory system 1 includes a memory controller 10 and a non-volatile memory 20. The memory system 1 is capable of being connected with a host 30, and FIG. 4 illustrates a state where the memory system 1 is connected with the host 30. The host 30 may be electronic equipment, for example, a personal computer, a mobile phone, or the like.

The non-volatile memory 20 is a non-volatile memory that stores data in a non-volatile manner, and is, for example, a NAND flash memory (hereinafter simply referred to as a NAND memory). Although the following description exemplifies a case in which a NAND memory is used as the non-volatile memory 20, a storage device other than the NAND memory, such as a three-dimensional structure flash memory, a resistance random access memory (ReRAM), or a ferroelectric random access memory (FeRAM), may be used as the non-volatile memory 20. Further, it is not essential that the non-volatile memory 20 be a semiconductor memory, and the present embodiment can be also applied to various storage media other than the semiconductor memory.

The memory system 1 may be a memory card or the like in which the memory controller 10 and the non-volatile memory 20 are configured as a single package, or may be a solid state drive (SSD) or the like.

The memory controller 10 controls write to the non-volatile memory 20 according to a write request from the host 30. Further, the memory controller 10 controls read from the non-volatile memory 20 according to a read request from the host 30. The memory controller 10 includes a host interface (host I/F) 15, a memory interface (memory I/F) 13, a control unit 11, an encoding/decoding unit (codec) 14, and a data buffer 12. The host I/F 15, the memory I/F 13, the control unit 11, the encoding/decoding unit 14, and the data buffer 12 are mutually connected via an internal bus 16.

The host I/F 15 executes a process according to the interface standard with the host 30, and outputs a command, user data to be written, and the like received from the host 30 to the internal bus 16. Further, the host I/F 15 transmits the user data which has been read from the non-volatile memory 20 and restored, a response from the control unit 11, and the like to the host 30.

The memory I/F 13 performs a write process to the non-volatile memory 20 based on an instruction of the control unit 11. Further, the memory I/F 13 performs a read process from the non-volatile memory 20 based on an instruction of the control unit 11.

The data buffer 12 temporarily stores the user data until the memory controller 10 stores the user data received from the host 30 in the non-volatile memory 20. Further, the data buffer 12 temporarily stores the user data read from the non-volatile memory 20 until being transmitted to the host 30. As the data buffer 12, it is possible to use a general-purpose memory, for example, a static random access memory (SRAM), a dynamic random access memory (DRAM), or the like.

The control unit 11 comprehensively controls various components of the memory system 1. In the case of receiving a command from the host 30 via the host I/F 15, the control unit 11 performs control according to the command. For example, the control unit 11 instructs the memory I/F 13 to write the user data and parity to the non-volatile memory 20 according to the command from the host 30. For example, the control unit 11 instructs the memory I/F 13 to read the user data and parity from the non-volatile memory 20 according to the command from the host 30.

Further, in the case of receiving the write request of the user data from the host 30, the control unit 11 determines a storage area (memory area) on the non-volatile memory 20 with respect to the user data to be accumulated in the data buffer 12. That is, the control unit 11 manages a write destination of the user data. An association between a logical address of the user data received from the host 30, and a physical address that indicates the storage area on the non-volatile memory 20 in which the user data is stored, is stored as an address conversion table.

Further, in the case of receiving the read request from the host 30, the control unit 11 converts the logical address instructed by the read request into the physical address using the above-described address conversion table, and instructs the memory I/F 13 to perform read from the physical address.

In the NAND memory, the write and the read are generally performed in a data unit of a so-called page, and erase is performed in a data unit of a so-called block. In the embodiment, a plurality of memory cells to be connected to the same word line are referred to as a memory cell group. In a case in which the memory cell is a single-level cell (SLC), one memory cell group is associated with one page. In a case in which the memory cell is a multi-level cell (MLC), one memory cell group is associated with a plurality of pages. Further, each memory cell is connected not only to the word line, but also to a bit line. Therefore, each memory cell can be identified by an address that identifies the word line, and an address that identifies the bit line.

The user data transmitted from the host 30 is transferred to the internal bus 16 and temporarily stored in the data buffer 12. The encoding/decoding unit 14 encodes user data stored in the non-volatile memory 20 to generate a code word. Further, the encoding/decoding unit 14 decodes a reception word read from the non-volatile memory 20 to restore the user data. Therefore, the encoding/decoding unit 14 includes an encoder 17 and a decoder 18. Incidentally, the data to be encoded by the encoding/decoding unit 14 may include control data and the like to be used in the memory controller 10 in addition to the user data.

Next, the write process of the present embodiment will be described. The control unit 11 instructs the encoder 17 to encode user data at the time of writing the user data to the non-volatile memory 20. At this time, the control unit 11 determines a storage location (storage address) of a code word in the non-volatile memory 20, and also instructs the memory I/F 13 of the determined storage location.

Based on an instruction from the control unit 11, the encoder 17 encodes the user data on the data buffer 12 to generate the code word. As an encoding scheme, for example, an encoding scheme using a Bose-Chandhuri-Hocquenghem (BCH) code or a Reed-Solomon (RS) code can be employed. The code word generated by the encoder 17 is a multi-dimensional error correction code such as the product code 200 exemplified with reference to FIG. 2 and the block product code 300 exemplified with reference to FIG. 3. The memory I/F 13 performs control to store the code word in the storage location on the non-volatile memory 20 instructed from the control unit 11.

Next, a process at the time of reading from the non-volatile memory 20 of the present embodiment will be described. At the time of reading from the non-volatile memory 20, the control unit 11 designates an address on the non-volatile memory 20 to instruct the memory I/F 13 to perform reading. Further, the control unit 11 instructs the decoder 18 to start decoding. The memory I/F 13 reads a reception word from the designated address of the non-volatile memory 20 according to the instruction of the control unit 11, and inputs the read reception word to the decoder 18. The decoder 18 decodes the reception word read from the non-volatile memory 20.

Figure 5:
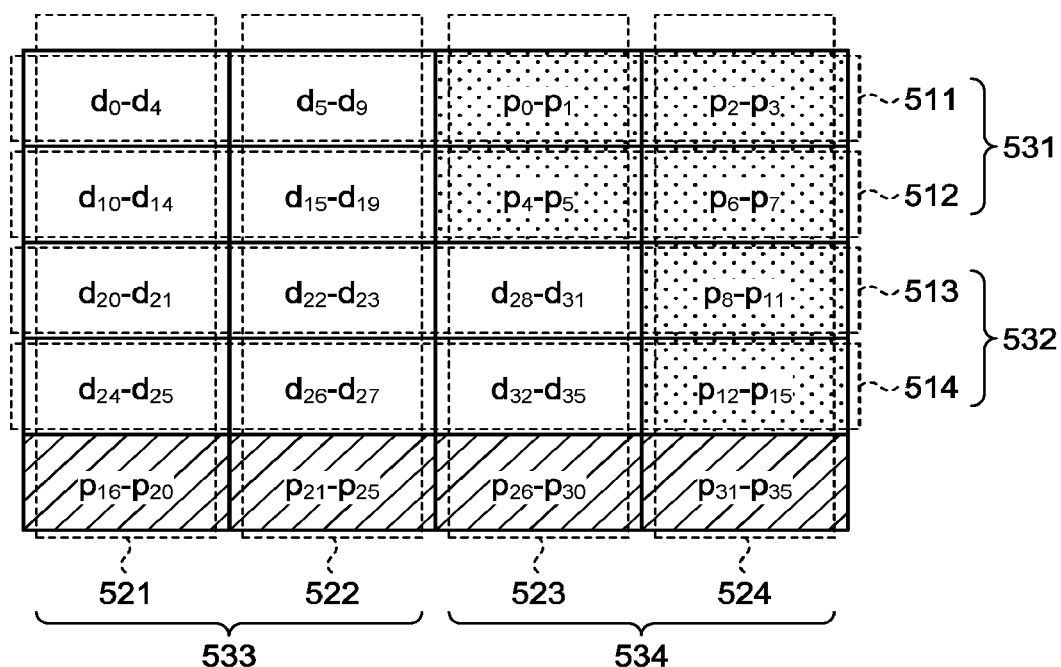
FIG. 5 is a view illustrating a configuration example of a multi-dimensional error correction code used in the first embodiment.

FIG. 5 is a view illustrating a configuration example of a multi-dimensional error correction code 500 used in the first embodiment. The multi-dimensional error correction code 500 is protected in multiple by component codes 511 to 514 in the row direction and component codes 521 to 524 in the column direction. Each of the component codes is classified into one of a plurality of component code groups as follows. Further, each of the component codes is a Hamming code having the following information length and parity length.

Component codes 511 and 512 in the row direction: Hamming codes belonging to a component code group 531 and having an information length of ten bits and a parity length of four bits Component codes 513 and 514 in the row direction: Hamming codes belonging to a component code group 532 and having an information length of eight bits and a parity length of four bits Component codes 521 and 522 in the column direction: Hamming codes belonging to a component code group 533 and having an information length of fourteen bits and a parity length of five bits Component codes 523 and 524 in the column direction: Hamming codes belonging to a component code group 534 and having an information length of twelve bits and a parity length of five bits The component code group 531 is a code having a lower error correction capability than the component code group 532. Further, the component code group 533 is a code having a lower error correction capability than the component code group 534. The relatively high error correction capability means that decoding can be successfully performed for a reception word having more errors. For example, a coding rate and a code length can be used as indices of the error correction capability, but are not limited to these indices, and any other index may be used. Therefore, the relatively low error correction capability means that the coding rate is relatively high and the code length is relatively short, for example.

The number of component code groups is not limited to two in each of the row direction and the column direction, and may be three or more. The number of component codes included in each component code group is not limited to two, and one or three or more component codes may be included. The component codes included in the component code groups 531, 532, 533, and 534 correspond to the first component code, the second component code, the third component code, and the fourth component code, respectively.

The multi-dimensional error correction code 500 illustrated in FIG. 5 sets the number and configuration of component codes in the row direction and the number and configuration of component codes in the column direction to be non-uniform and the number of shared bits differs among the plurality of component codes.

Further, both the component code groups 531 and 532 are groups for the component codes in the row direction in the multi-dimensional error correction code 500 of FIG. 5, and thus, there is no symbol that is commonly encoded by the component code group 531 and the component code group 532. Similarly, both the component code groups 533 and 534 are groups for the component codes in the column direction, and thus, there is no symbol that is commonly encoded by the component code group 533 and the component code group 534.

Figure 6:
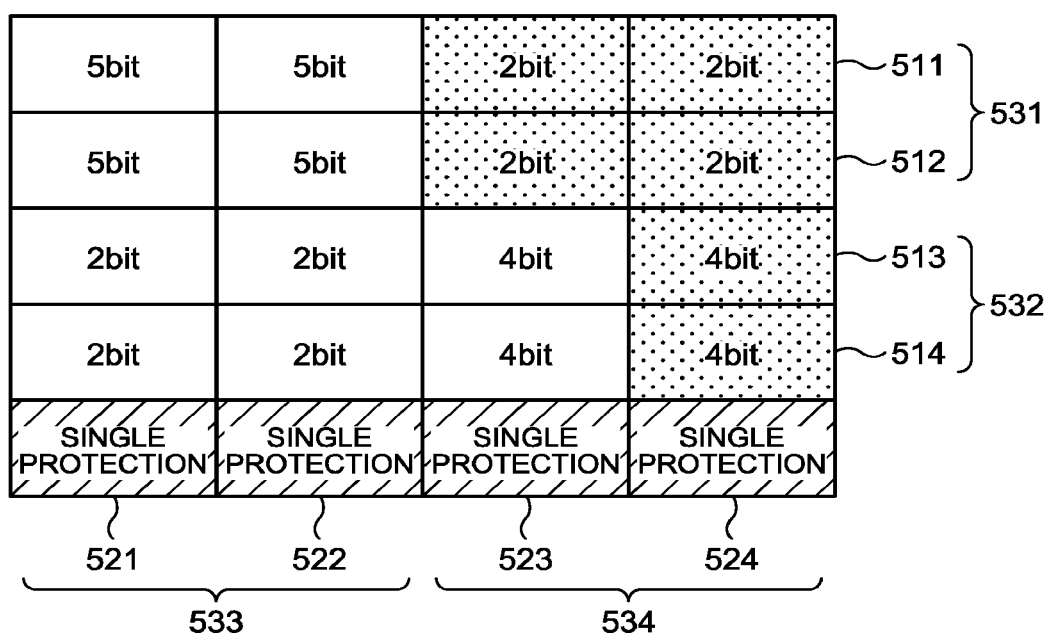
FIG. 6 is a view illustrating the number of shared bits of each of component codes of a multi-dimensional error correction code.

FIG. 6 is a view illustrating the number of shared bits of each of the component codes of the multi-dimensional error correction code 500. For example, the component code 511 and the component code 521 have five shared bits. The component code 511 and the component code 523 have two shared bits. Portions corresponding to the parity bits $p_{16}$ to $p_{35}$ in the column direction are not protected (not shared) by the component codes in the row direction, and thus, are displayed as single protection.

As illustrated in FIG. 6, the multi-dimensional error correction code 500 is designed to have the following number of shared bits.

Number of shared bits between codes belonging to component code group 531 and codes belonging to component code group 533: five bits Number of shared bits between codes belonging to component code group 531 and codes belonging to component code group 534: two bits Number of shared bits between codes belonging to component code group 532 and codes belonging to component code group 533: two bits Number of shared bits between codes belonging to component code group 532 and codes belonging to component code group 534: four bits Here, Conditions (1) and (2) are defined as follows.

Condition (1): To be protected by the component code group 531 and protected by at least one of the component code groups 533 and 534.

Condition (2): To be protected by the component code group 532 and protected by at least one of the component code groups 533 and 534.

Figure 7:
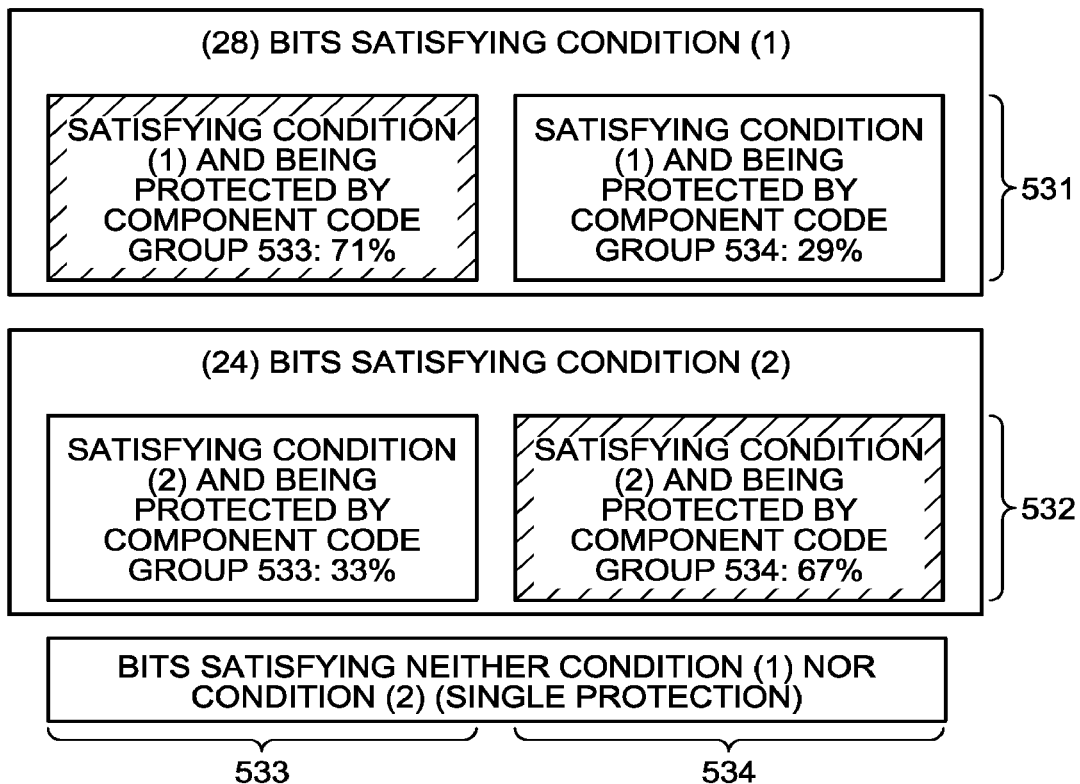
FIG. 7 is a view illustrating an example of a relationship between each of conditions and a ratio of symbols protected by each of the component codes in a symbol group satisfying each of the conditions.

FIG. 7 is a view illustrating an example of a relationship between each of conditions and a ratio of symbols protected by component codes of each of component code groups in a symbol group satisfying each of the conditions. FIG. 7 illustrates an example of the ratio for the multi-dimensional error correction code 500 illustrated in FIG. 5. As illustrated in FIG. 7, the number of symbols satisfying Condition (1) is 28, and the number of symbols satisfying Condition (2) is 24.

Here, a ratio of symbols protected by the component code group 533 in a symbol group satisfying Condition (1) is 20/28≈71%. Further, a ratio of symbols protected by the component code group 534 in a symbol group satisfying Condition (1) is 8/28≈29%.

On the other hand, a ratio of symbols protected by the component code group 533 in the symbol group satisfying Condition (2) is 8/24≈33%. Further, a ratio of symbols protected by the component code group 534 in the symbol group satisfying Condition (2) is 16/24≈67%.

Therefore, the multi-dimensional error correction code 500 has properties that the probability of being protected by the component code group 533 is high if a symbol satisfies Condition (1) (that is, protected by the component code group 531) and the probability of being protected by the component code group 534 is high if a symbol satisfies Condition (2) (that is, protected by the component code group 532).

In other words, in the multi-dimensional error correction code 500, the ratio of symbols protected by the component code group 534 is smaller than the ratio of symbols protected by the component code group 533 in the symbol group satisfying Condition (1). Further, in the multi-dimensional error correction code 500, the ratio of symbols protected by the component code group 534 is larger than the ratio of symbols protected by the component code group 533 in the symbol group satisfying Condition (2).

Incidentally, for example, the ratio of symbols protected by the component code group 534 may be 0% in the symbol group protected by the component code group 531. That is, the number of symbols included in the symbol group protected by the component code group 531 and protected by the component code group 534 may be zero. Similarly, the ratio of symbols protected by the component code group 533 in the symbol group protected by the component code group 532 may be 0% (the number of symbols included in the symbol group protected by the component code group 532 and protected by the component code group 533 may be 0).

As described above, the component code group 531 has the lower correction capability than the component code group 532, and the component code group 533 has the lower correction capability than the component code group 534. For this reason, it can be said that there are many shared bits between the component code groups having the low correction capability and between the component code groups having the high correction capability in the multi-dimensional error correction code 500.

In this manner, when there are "many shared bits between the component code groups having the low correction capability and between the component code groups having the high correction capability" and "the number of shared bits between the component code group having the low correction capability and the group having the high correction capability is reduced", there is a possibility that the correction capability of the multi-dimensional error correction code can be enhanced.

Figure 8:
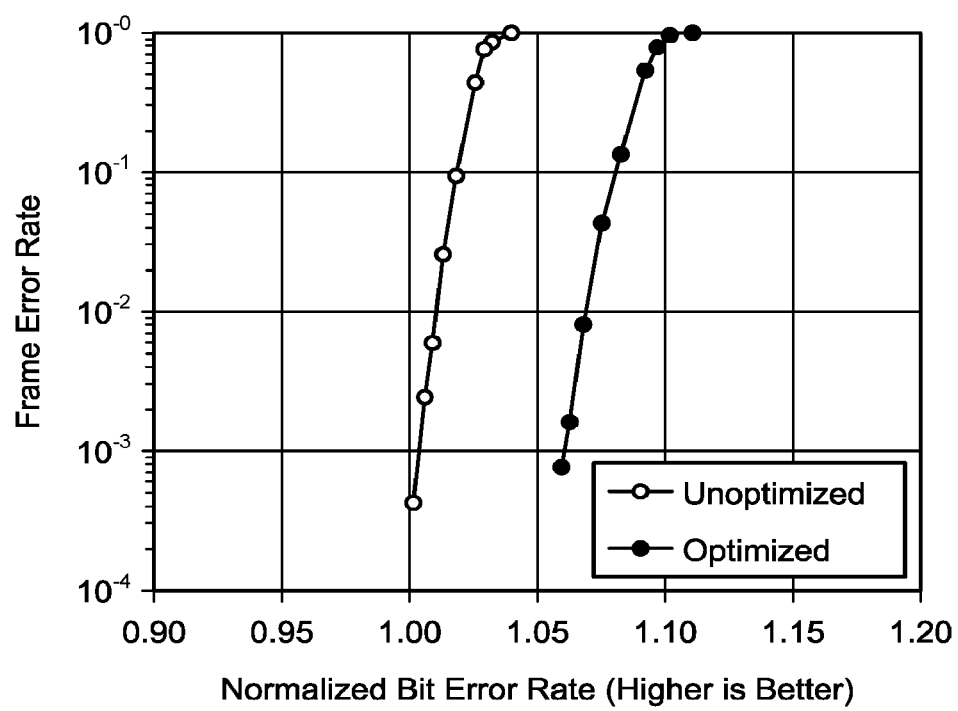
FIG. 8 is a graph illustrating a relationship between a bit error rate and a frame error rate.

For example, FIG. 8 illustrates bit error rate-frame error rate curves in a case of using a product code having a non-uniform structure in which the distribution of the number of shared bits is appropriately designed and in a case of using a product code having a uniform structure when assuming a model that performs communication on an additive white gaussian noise (AWGN) channel modulated by binary phase-shift keying (BPSK). It is possible to read that decoding has succeeded at a higher bit error rate, that is, the error correction capability has been improved in Optimized (the product code having the non-uniform structure) as compared to Unoptimized (the product code having the uniform structure).

Figure 9:
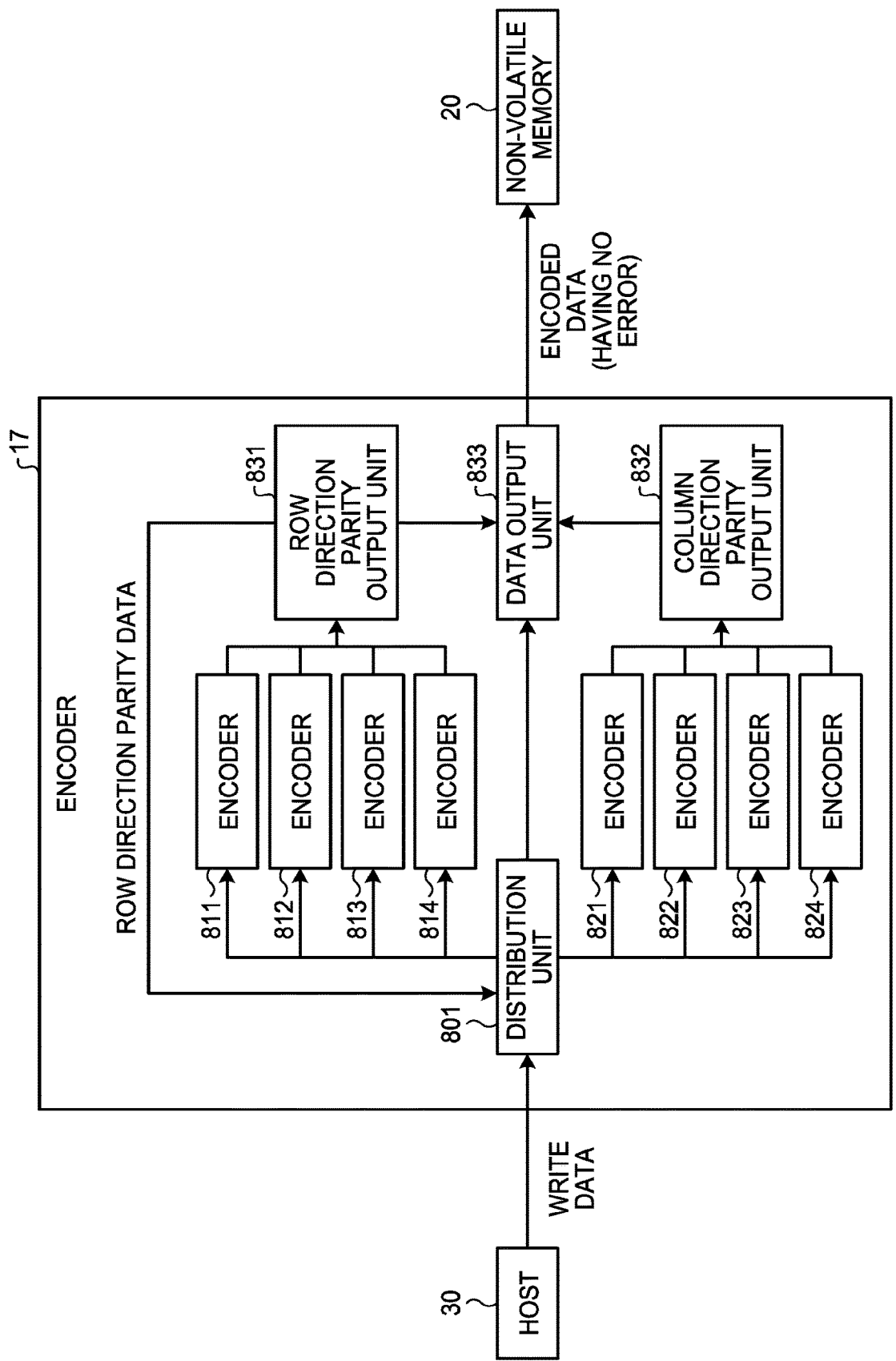
FIG. 9 is a block diagram illustrating a functional configuration example of an encoder.

Next, a configuration example of the encoder 17 that encodes the multi-dimensional error correction code as described above will be described. FIG. 9 is a block diagram illustrating a functional configuration example of the encoder 17. The encoder 17 in FIG. 9 is an example of the encoder that encodes a multi-dimensional error correction code 500 having a code length of 72 bits illustrated in FIG. 5 by receiving a total of 36 information bits and adding a total of 36 parity bits.

As illustrated in FIG. 9, the encoder 17 includes a distribution unit 801, encoders 811 to 814, encoders 821 to 824, a row direction parity output unit 831, a column direction parity output unit 832, and a data output unit 833.

The distribution unit 801 distributes write data received from the host 30 to the encoders 811 to 814, the encoders 821 to 824, and the data output unit 833. Hereinafter, the write data may be referred to as information bits.

The encoders 811 to 814 perform an encoding process using the information bits received from distribution unit 801, and output parity bits of component codes in the row direction. For example, the encoders 811 to 814 correspond to encoders that output the component codes 511 to 514, respectively.

The encoders 821 to 824 perform an encoding process using the information bits received from distribution unit 801, and output parity bits of component codes in the column direction. For example, the encoders 821 to 824 correspond to encoders that output the component codes 521 to 524, respectively.

The row direction parity output unit 831 outputs the parity bits output from the encoders 811 to 814 to the distribution unit 801 and the data output unit 833. The column direction parity output unit 832 outputs the parity bits output from the encoders 821 to 824 to the data output unit 833.

The data output unit 833 selects any of the data received from the distribution unit 801, the row direction parity output unit 831 and the column direction parity output unit 832, and outputs the selected data to the non-volatile memory 20.

The configuration of the encoder 17 illustrated in FIG. 9 is an example, and the invention is not limited thereto. For example, when the error correction code 500 having a different structure from FIG. 5 is encoded, the encoder 17 may be configured in accordance with such a structure. For example, when the number of component codes in the row direction (column direction) is other than four, the encoder 17 may include the number of encoders in the row direction (column direction) corresponding thereto, and the encoder 17 may include one encoder used to encode a plurality of component codes.

Figure 10:
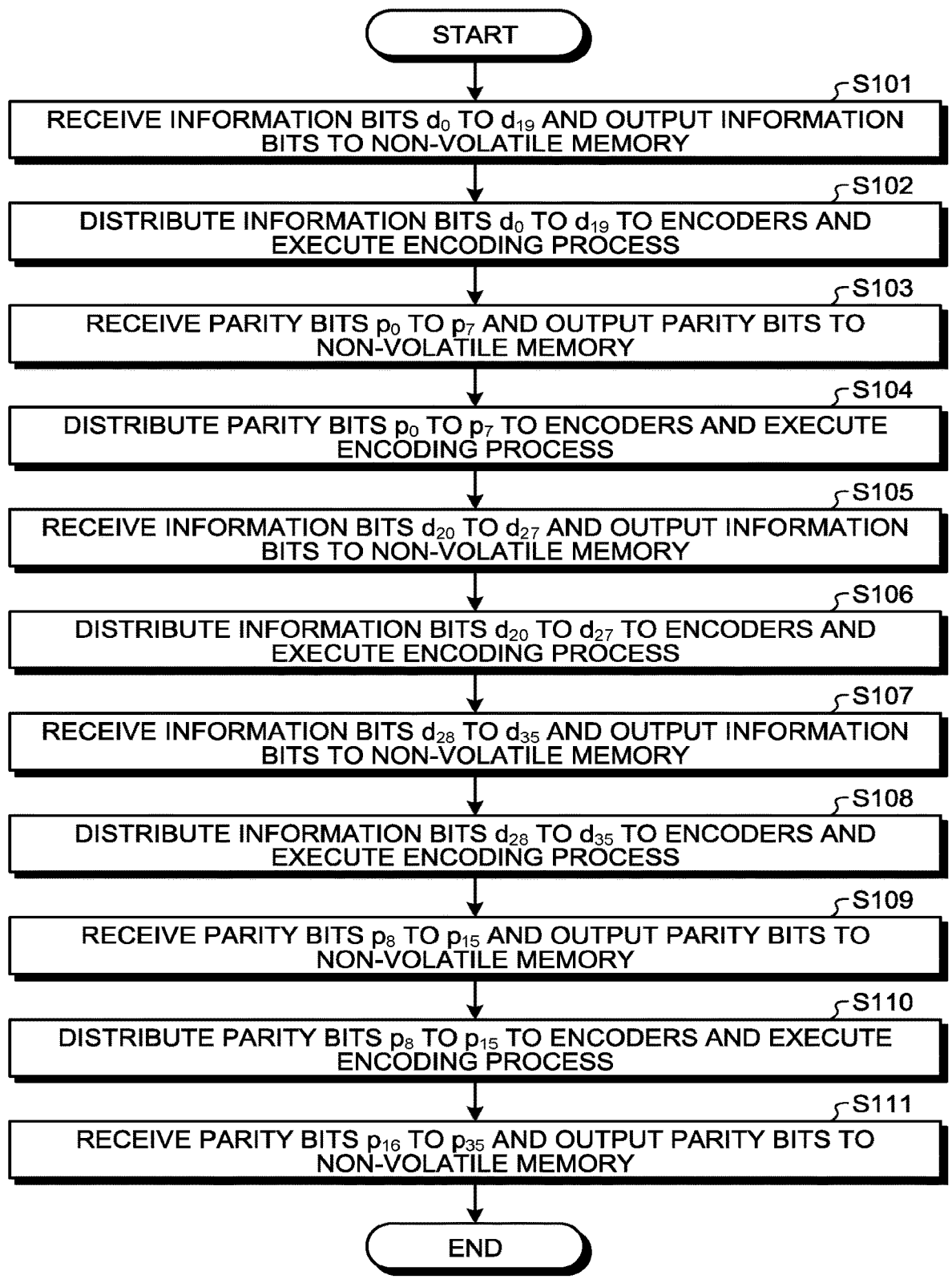
FIG. 10 is a flowchart illustrating an example of a procedure for encoding a multi-dimensional error correction code.

Next, a procedure of the encoding process performed by the encoder 17 will be described. FIG. 10 is a flowchart illustrating an example of the procedure in which the encoder 17 encodes the multi-dimensional error correction code 500.

When receiving information bits $d_0$ to $d_{19}$ from the host 30, the distribution unit 801 outputs the received information bits $d_0$ to $d_{19}$ to the non-volatile memory 20 via the data output unit 833 (Step S101). Further, the distribution unit 801 distributes the received information bits evenly to the row direction encoders 811 and 812 and the column direction encoders 821 and 822. The encoders 811, 812, 821, and 822 execute the encoding process using the input information bits (Step S102).

Incidentally, for example, the encoders 821 and 822 need to further receive information bits $d_{20}$ to $d_{27}$ in order to output the component codes 521 and 522, respectively. Since only the information bits $d_0$ to $d_{19}$ are received at the time of Step S102, the encoders 821 and 822 execute a process using the information bits $d_0$ to $d_{19}$ among the processes configured to output the component codes 521 and 522. Similarly, in the following description, each of the encoders (811 to 814 and 821 to 824) executes an executable process using the received information bits or parity bits. Incidentally, each of the encoders (811 to 814 and 821 to 824) may be configured so as to execute the encoding process when all the information bits required to output the corresponding component code have been obtained.

The row direction parity output unit 831 outputs parity bits $p_0$ to $p_7$ output from the row direction encoders 811 and 812 to the distribution unit 801 and the data output unit 833. The data output unit 833 outputs the parity bits $p_0$ to $p_7$ to the non-volatile memory 20 (Step S103).

The distribution unit 801 distributes the input parity bits $p_0$ to $p_7$ evenly to the column direction encoders 823 and 824. The encoders 823 and 824 execute the encoding process using the input parity bits (Step S104).

When receiving information bits $d_{20}$ to $d_{27}$ from the host 30, the distribution unit 801 outputs the received information bits $d_{20}$ to $d_{27}$ to the non-volatile memory 20 via the data output unit 833 (Step S105). Further, the distribution unit 801 distributes the received information bits evenly to the row direction encoders 813 and 814 and the column direction encoders 821 and 822. The encoders 813, 814, 821, and 822 execute the encoding process using the input information bits (Step S106).

When receiving information bits $d_{28}$ to $d_{35}$ from the host 30, the distribution unit 801 outputs the received information bits $d_{28}$ to $d_{35}$ to the non-volatile memory 20 via the data output unit 833 (Step S107). Further, the distribution unit 801 distributes the received information bits $d_{28}$ to $d_{35}$ evenly to the row direction encoders 813 and 814. Further, the distribution unit 801 distributes the received information bits $d_{28}$ to $d_{35}$ to the column direction encoder 823. The encoders 813, 814, and 823 execute the encoding process using the input information bits (Step S108).

The row direction encoders 813 and 814 output parity bits $p_8$ to $p_{15}$ by the encoding process. The row direction parity output unit 831 outputs the parity bits $p_8$ to $p_{15}$ to the distribution unit 801 and the data output unit 833. The data output unit 833 outputs the input parity bits $p_8$ to $p_{15}$ to the non-volatile memory 20 (Step S109).

The distribution unit 801 distributes the parity bits $p_8$ to $p_{15}$ to the column direction encoder 824. The encoder 824 executes the encoding process using the input parity bits (Step S110).

With the above processing, parity bits $p_{16}$ to $p_{35}$ are output from the column direction encoders 821, 822, 823, and 824. The column direction parity output unit 832 outputs the parity bits $p_{16}$ to $p_{35}$ to the data output unit 833. The data output unit 833 outputs the received parity bits $p_{16}$ to $p_{35}$ to the non-volatile memory 20 (Step S111).

With the above procedure, the encoder 17 can encode the multi-dimensional error correction code 500 having the non-uniform structure illustrated in FIG. 5.

Figure 11:
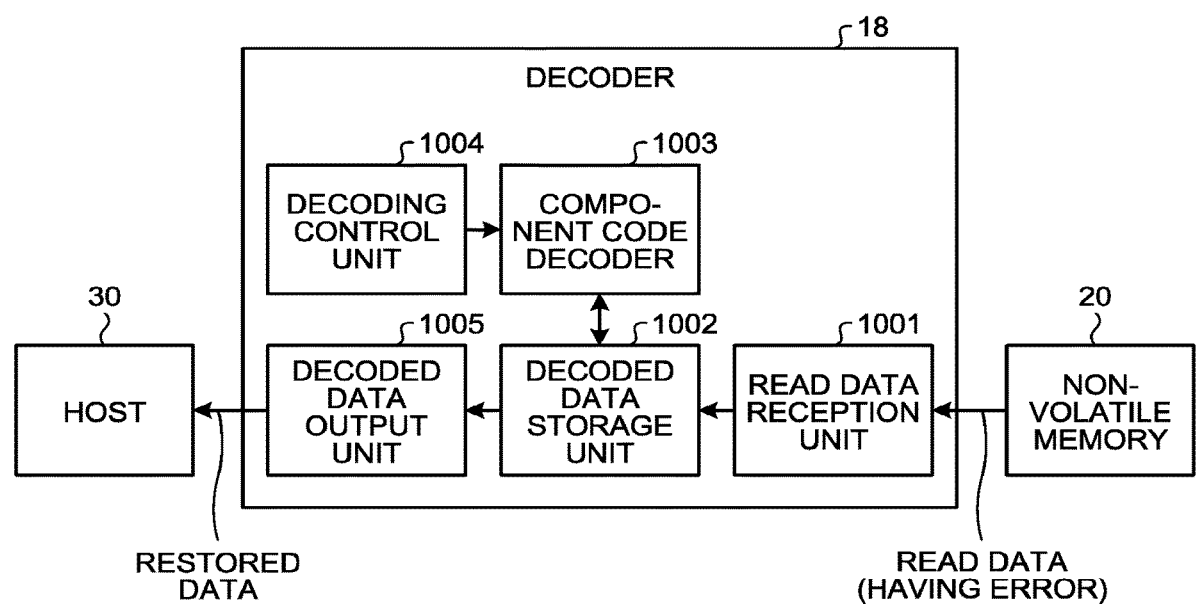
FIG. 11 is a block diagram illustrating a functional configuration example of a decoder.

Next, a configuration example of the decoder 18 will be described. FIG. 11 is a block diagram illustrating a functional configuration example of the decoder 18. As illustrated in FIG. 11, the decoder 18 includes a data reception unit 1001, a decoded data storage unit 1002, a component code decoder 1003, a decoding control unit 1004, and a data output unit 1005.

The data reception unit 1001 receives read data (reception word) read from the non-volatile memory 20. The decoded data storage unit 1002 stores the received read data.

For example, in the case of decoding the multi-dimensional error correction code 500 that has been encoded using the encoder 17, the decoded data storage unit 1002 stores read data corresponding to 36 bits. The decoded data storage unit 1002 is not limited to the read data, and may store only a syndrome for each component code calculated from the read data, for example.

The decoding control unit 1004 controls a decoding process that decodes a multi-dimensional error correction code in units of component codes. The component code decoder 1003 performs the decoding process in units of component codes according to the control from the decoding control unit 1004. The decoded data (restored data) may be stored in the decoded data storage unit 1002.

The data output unit 1005 outputs the restored data to the host 30.

Figure 12:
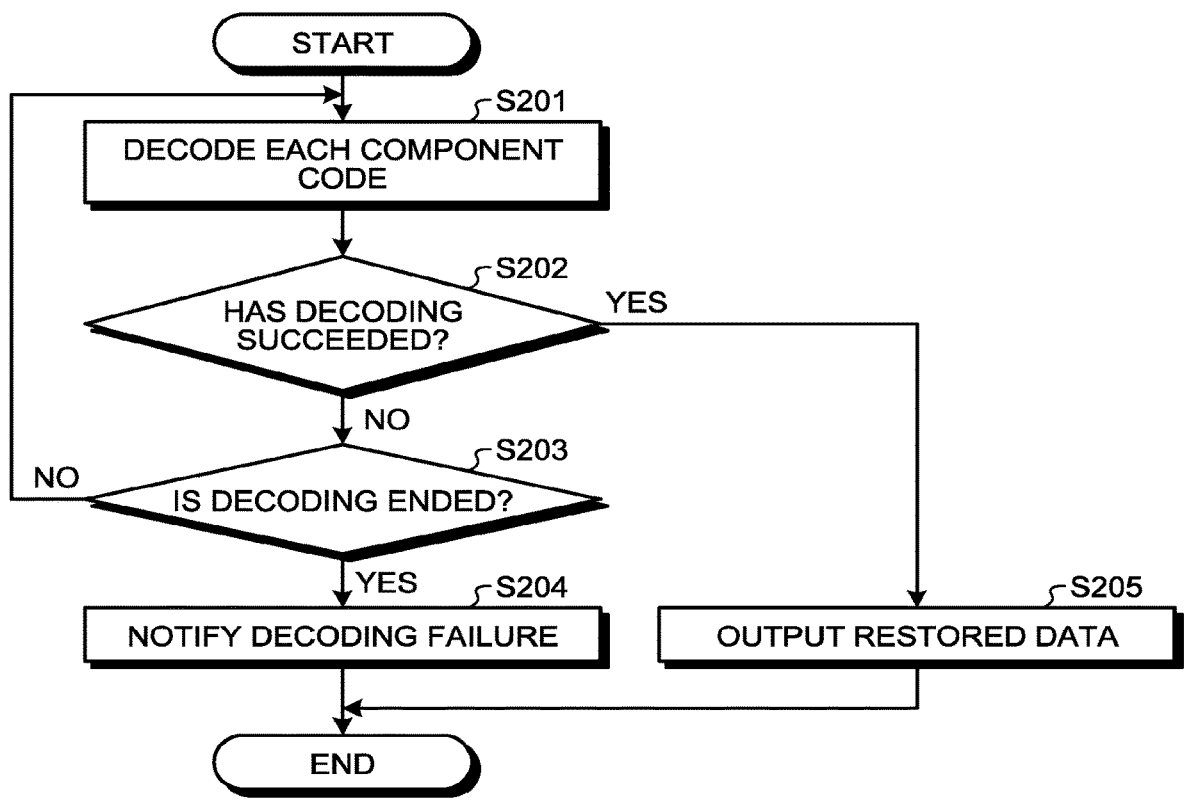
FIG. 12 is a flowchart illustrating an example of a procedure for decoding a multi-dimensional error correction code.

Next, a procedure of the decoding process performed by the decoder 18 will be described. FIG. 12 is a flowchart illustrating an example of the procedure in which the decoder 18 decodes the multi-dimensional error correction code 500.

The component code decoder 1003 decodes each component code according to the control of the decoding control unit 1004 (Step S201). For example, the component code decoder 1003 first reads information required to decode the component code 511 from the decoded data storage unit 1002, and performs a decoding process on the component code 511. Here, the information required to decode the component code 511 is, for example, a symbol group constituting the component code 511. If one or more error symbols are detected by the decoding process of the component code 511, the error is corrected, and then, the corrected information is stored in the decoded data storage unit 1002. If no error position is detected, the component code decoder 1003 does nothing.

Similarly, the component code decoder 1003 also performs a decoding process and an error correction process for the component codes 512 to 514 and the component codes 521 to 524.

The decoding control unit 1004 determines whether or not the decoding has succeeded (Step S202). For example, if all errors have been successfully corrected, the decoding control unit 1004 determines that decoding has succeeded. If the decoding has succeeded (Step S202: Yes), the data output unit 1005 outputs the decoded data (restored data) to the host 30 (Step S205).

If all the errors have not been corrected, that is, if the decoding has not been succeeded (Step S202: No), the decoding control unit 1004 determines whether or not to end the decoding (Step S203). For example, the decoding control unit 1004 determines to end the decoding when the number of times of decoding reaches an upper-limit set in advance.

When the decoding is not to be ended (Step S203: No), the decoding control unit 1004 returns to Step S201 and restarts the decoding process in order from the component code 511 again. When the decoding is to be ended (Step S203: Yes), the data output unit 1005 notifies that the decoding has failed (Step S204).

In this manner, the decoder 18 applies the iterative decoding process in units of component codes with respect to the multi-dimensional error correction code 500 having the non-uniform structure, whereby the error correction process can be performed efficiently.

The above embodiment can be modified as follows. Incidentally, the following modifications can be applied even to an embodiment to be described later.

(First Modification)

An arrangement order of information bits and parity bits may be replaced. For example, the consecutive information bits $d_0$ to $d_4$ are shared by the component codes 511 and 521 in FIG. 5, but non-consecutive information bits such as information bits $d_0$, $d_4$, $d_8$, $d_{12}$, and $d_{16}$ may be shared by a plurality of component codes. If the consecutive bits are not protected by the same component code in this manner, it is possible to improve the correction capability for a burst error.

(Second Modification)

Although the case in which the codes encoded by the row direction encoders 811 to 814 and the column direction encoders 821 to 824 are all the Hamming codes has been illustrated as an example so far, some or all of these encoders may be encoders of other error correction codes such as BCH codes and RS codes. The BCH codes and RS codes are examples of algebraic codes. Algebraic codes other than the BCH codes and RS codes may be used.

(Third Modification)

A processing order of each step in the flowchart illustrated in FIG. 10 may be replaced. For example, the encoder 17 may process the information bits $d_0$ to $d_{19}$ (Steps S101 and S102) after processing the information bits $d_{20}$ to $d_{27}$ (Steps S105 and S106). The encoder 17 may alternately process bits to be processed in a plurality of steps in FIG. 10 so as to have the processing order of information bits $d_0$, $d_{20}$, $d_1$, $d_{21}$, and so on.

(Fourth Modification)

The number of information bits and parity bits to be processed in each step may be changed. For example, the number of information bits received in Step S101 may be eighteen bits instead of twenty bits. In such a case, for example, the number of shared bits between the component codes 511 and 521 and the between component codes 512 and 522 is five bits, and the number of shared bits between the component codes 511 and 522 and between the component codes 512 and 521 is four bits. As a result, an average value of the number of shared bits between the component code group 531 and the component code group 533 is (5+5+4+4)/4=4.5 bits.

(Fifth Modification)

The multi-dimensional error correction code is not limited to the above examples, and other multi-dimensional error correction codes may be used. For example, some of the row direction encoders 811 to 814 and some of the column direction encoders 821 to 824 are not necessarily used. That is, a multi-dimensional error correction code can be output if at least one encoder is used in each of the row direction and the column direction. Further, the maximum value of multiplicity of protection of bits of the multi-dimensional error correction code 500, that is, the number of dimensions is two, but the maximum value of multiplicity of protection may be a number larger than two.

(Sixth Modification)

The procedure of the process performed by the encoder 17 may be hard-coded at the time of designing a circuit and may be changeable from the outside through a setting register, software, and the like. For example, the number of symbols commonly encoded by a plurality of component codes (such as the number of shared bits between component codes) may be settable by a setting register or the like. The encoder 17 distributes write data received from the host 30 so that the set number is satisfied, and encodes the write data using row direction and column direction encoders.

Instead of individually setting the number of shared bits between a plurality of component codes, a ratio of symbols (shared bits or the like) to be commonly encoded with other component code groups with respect to all symbols included in each of the component code groups may be settable. For each of the plurality of component code groups, the encoder 17 executes an encoding process such that the ratio of symbols (shared bits) to be commonly encoded with other component code groups becomes the set ratio.

When the procedure of the encoding process performed by the encoder 17 can be changed from the outside in this manner, it is possible to flexibly encode error correction codes having various configurations.

Second Embodiment

The component codes in the row direction and the column direction are used in the first embodiment. A second embodiment is an example using component codes that do not distinguish the row direction from the column direction. FIG. 13 is a block diagram illustrating a functional configuration example of an encoder 17-2 according to the second embodiment. The encoder 17-2 has substantially the same configuration as the encoder 17 of the first embodiment, but is different in terms that an encoder in the row direction and an encoder in the column direction are not distinguished.

The encoder 17-2 includes a distribution unit 801-2, encoders 811-2 to 818-2, a parity output unit 831-2, and a data output unit 833-2.

The distribution unit 801-2 distributes write data received from the host 30 to the encoders 811-2 to 818-2 and the data output unit 833-2. The encoders 811-2 to 818-2 perform an encoding process using information bits received from distribution unit 801-2, and output parity bits of the component codes. The parity output unit 831-2 outputs the parity bits output from the encoders 811-2 to 818-2 to the distribution unit 801-2 and the data output unit 833-2. The data output unit 833-2 selects any of the data received from the distribution unit 801-2 and the parity output unit 831-2, and outputs the selected data to the non-volatile memory 20.

In the encoder 17 of the first embodiment, there is no shared bit between the component codes in the row direction (for example, the component codes 511 and 512). On the other hand, it is possible to have a shared bit among all the component codes in the encoder 17-2 of the second embodiment.

When adopting the configuration in which the component code in the row direction and the component code in the column code are not distinguished and the shared bit can be present among all the component codes in this manner, a more flexible code design can be performed as compared to the encoder 17 of the first embodiment.

As an error correction code that can have the shared bit among all the component codes, there is an error correction code called a half product code. The half product code is designed such that the number of shared bits among all component codes is equal. On the other hand, the error correction code encoded by the encoder 17-2 of the present embodiment can be also configured such that the number of shared bits between the respective component codes is not equal. Therefore, it is possible to obtain a higher error correction capability than the half product code.

A decoder that decodes the multi-dimensional error correction code of the second embodiment can have the same configuration as the decoder 18 of the first embodiment. For example, the decoder 18 can execute a decoding process by sequentially decoding the respective component codes of the multi-dimensional error correction code according to the same procedure as in FIG. 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory; and
   a memory controller configured to
   generate an error correction code based on user data received from a host, the error correction code including a first symbol group and a second symbol group, the first symbol group being a set of symbols shared between a first component code and at least one of a third component code and a fourth component code, the second symbol group being a set of symbols shared between a second component code and at least one of the third component code and the fourth component code, and
   store the error correction code in the non-volatile memory,
   wherein the memory controller is configured to:
   encode the first component code with a lower correction capability than the second component code,
   encode the third component code with a lower correction capability than the fourth component code,
   set a ratio of symbols shared between the second component code and the third component code in the second symbol group to be smaller than a ratio of symbols shared between the first component code and the third component code in the first symbol group, and
   set a ratio of symbols shared between the second component code and the fourth component code in the second symbol group to be larger than a ratio of symbols shared between the first component code and the fourth component code in the first symbol group.

2. The memory system according to claim 1, wherein the memory controller is configured to encode the error correction code such that
   a number of symbols shared between the first component code and the third component code among the symbols included in the first symbol group,
   a number of symbols shared between the first component code and the fourth component code among the symbols included in the first symbol group,
   a number of symbols shared between the second component code and the third component code among the symbols included in the second symbol group, and
   a number of symbols shared between the second component code and the fourth component code among the symbols included in the second symbol group
   become set numbers, respectively.

3. The memory system according to claim 1, wherein
   the first component code, the second component code, the third component code, and the fourth component code are included in any one component code group of a plurality of component code groups different from each other, and
   the memory controller is configured to encode the error correction code for each of the plurality of component code groups such that a ratio of symbols shared with another component code group with respect to all symbols included in the component code group becomes a set ratio.

4. The memory system according to claim 1, wherein there is no symbol shared between the first component code and the second component code and no symbol shared between the third component code and the fourth component code.

5. The memory system according to claim 1, wherein at least one of the first component code, the second component code, the third component code, and the fourth component code is an algebraic code.

6. The memory system according to claim 5, wherein the algebraic code is a BCH code.

7. The memory system according to claim 5, wherein the algebraic code is a Reed-Solomon code.

8. The memory system according to claim 1, wherein the correction capability is a coding rate.

9. The memory system according to claim 1, wherein the correction capability is a code length.

10. The memory system according to claim 1, wherein the memory controller is configured to read the first component code, the second component code, the third component code, and the fourth component code from the non-volatile memory, and execute a decoding process on the read first component code, second component code, third component code, and fourth component code.

11. A method for controlling a non-volatile memory, the method comprising:

generating an error correction code based on user data received from a host, the error correction code including a first symbol group and a second symbol group, the first symbol group being a set of symbols shared between a first component code and at least one of a third component code and a fourth component code, the second symbol group being a set of symbols shared between a second component code and at least one of the third component code and the fourth component code; and storing the error correction code in the non-volatile memory, wherein the generation of the error correction code comprises:

encoding the first component code with a lower correction capability than the second component code;

encoding the third component code with a lower correction capability than the fourth component code;

setting a ratio of symbols shared between the second component code and the third component code in the second symbol group to be smaller than a ratio of symbols shared between the first component code and the third component code in the first symbol group; and setting a ratio of symbols shared between the second component code and the fourth component code in the second symbol group to be larger than a ratio of symbols shared between the first component code and the fourth component code in the first symbol group.

12. The method according to claim 11, further comprising encoding the error correction code such that a number of symbols shared between the first component code and the third component code among the symbols included in the first symbol group, a number of symbols shared between the first component code and the fourth component code among the symbols included in the first symbol group, a number of symbols shared between the second component code and the third component code among the symbols included in the second symbol group, and a number of symbols shared between the second component code and the fourth component code among the symbols included in the second symbol group become set numbers, respectively.

13. The method according to claim 11, wherein the first component code, the second component code, the third component code, and the fourth component code are included in any one component code group of a plurality of component code groups different from each other, the method further comprising encoding the error correction code for each of the plurality of component code groups such that a ratio of symbols shared with another component code group with respect to all symbols included in the component code group becomes a set ratio.

14. The method according to claim 11, wherein there is no symbol shared between the first component code and the second component code and no symbol shared between the third component code and the fourth component code.

15. The method according to claim 11, wherein at least one of the first component code, the second component code, the third component code, and the fourth component code is an algebraic code.

16. The method according to claim 15, wherein the algebraic code is a BCH code.

17. The method according to claim 15, wherein the algebraic code is a Reed-Solomon code.

18. The method according to claim 11, wherein the correction capability is a coding rate.

19. The method according to claim 11, wherein the correction capability is a code length.

20. The method according to claim 11, further comprising:

reading the first component code, the second component code, the third component code, and the fourth component code from the non-volatile memory; and executing a decoding process on the read first component code, second component code, third component code, and fourth component code.

* * * * *